(12) United States Patent
Su et al.

(10) Patent No.: US 9,123,287 B2
(45) Date of Patent: Sep. 1, 2015

(54) SYSTEM FOR DISPLAYING IMAGES

(75) Inventors: Po-Kun Su, Sijhih (TW); Ryuji Nishikawa, Hsinchu (TW)

(73) Assignee: INNOLUX CORPORATION, Miao-Li County (TW)

( * ) Notice: Subject to any disclaimer, the term of this patent is extended or adjusted under 35 U.S.C. 154(b) by 882 days.

(21) Appl. No.: 13/047,523

(22) Filed: Mar. 14, 2011

(65) Prior Publication Data
US 2011/0227963 A1 Sep. 22, 2011

(30) Foreign Application Priority Data
Mar. 17, 2010 (TW) .............................. 99107766 A

(51) Int. Cl.
*G09G 3/30* (2006.01)
*G09G 3/32* (2006.01)
*G09G 3/20* (2006.01)

(52) U.S. Cl.
CPC ............ *G09G 3/3208* (2013.01); *G09G 3/2074* (2013.01); *G09G 2300/0452* (2013.01)

(58) Field of Classification Search
CPC ........................... G09G 3/3208; G09G 3/2074
USPC ...................................... 345/690, 76; 313/512
See application file for complete search history.

(56) References Cited

U.S. PATENT DOCUMENTS

| | | | | |
|---|---|---|---|---|
| 2005/0189857 A1* | 9/2005 | Kobori | ........................ | 313/110 |
| 2005/0194899 A1* | 9/2005 | Matsuoka | .................... | 313/512 |
| 2006/0214579 A1* | 9/2006 | Iwase et al. | ................... | 313/512 |
| 2007/0171493 A1* | 7/2007 | Nakanishi | ....................... | 359/15 |
| 2010/0039030 A1* | 2/2010 | Winters et al. | ............... | 313/505 |

FOREIGN PATENT DOCUMENTS

| | | |
|---|---|---|
| TW | 200601890 | 1/2006 |
| TW | 200524474 | 5/2006 |
| TW | I272866 | 2/2007 |

OTHER PUBLICATIONS

Taiwanese language office action dated Oct. 14, 2013.
English language translation of abstract of TW 200524474 (published May 21, 2006).
English language translation of abstract of TW 200601890 (published Jan. 1, 2006).
English language translation of abstract of TW I272866 (published Feb. 1, 2007).

* cited by examiner

*Primary Examiner* — Amare Mengistu
*Assistant Examiner* — Sarvesh J Nadkarni
(74) *Attorney, Agent, or Firm* — McClure, Qualey & Rodak, LLP

(57) ABSTRACT

A system for displaying images employing a pixel structure. The pixel structure includes a first sub-pixel, a second sub-pixel, a third sub-pixel, and a filling layer. Particularly, each sub-pixel includes a color filter layer, and an electroluminescent element corresponding to the color filter layer. The transmittances of the color filter layers of the first sub-pixel, the second sub-pixel, and third sub-pixel, for a radiance level used for curing the filling layer, are determined according to the following equation: transmittance of the color filter layer of the first sub-pixel>transmittance of the color filter layer of the second sub-pixel>transmittance of the color filter layer of the third sub-pixel. Further, the distance between the first and second sub-pixels is greater than that between the first and third sub-pixels.

11 Claims, 11 Drawing Sheets

SYSTEM FOR DISPLAYING IMAGES

CROSS REFERENCE TO RELATED APPLICATIONS

This application is based upon and claims the benefit of priority from the prior Taiwan Patent Application No. 099107766, filed on Mar. 17, 2010, the entire contents of which are incorporated herein by reference.

BACKGROUND OF THE INVENTION

1. Field of the Invention

The invention relates to a system for displaying images, and more particularly to a system for displaying images which includes an organic electroluminescent device with a specific pixel structure.

2. Description of the Related Art

Recently, with the development and wide application of electronic products, such as mobile phones, and notebook computers, there has been an increasing demand for flat display elements which consume less power and occupy less space. Organic electroluminescent elements are popular for use in flat panel displays as they are self-emitting and highly luminous, provide wide viewing angles, have a fast response speed, and a simple fabrication process. In order to achieve full-color display, various color filters have been further applied in organic electroluminescent devices.

U.S. Pat. No. 7,416,917 discloses a top-emission organic electroluminescent device 100 including a bottom substrate 110, a top substrate 120, organic electroluminescent elements 112, 114, and 116, a red color filter 118R, a blue color filter 118B, and a green color filter 118G, as shown in FIG. 1, for achieving full-color display.

Since the color filters (including the red color filter 118R, blue color filter 118B, and green color filter 118G) are directly formed on the organic electroluminescent element 116 and the color filters cannot be dovetailed with the organic electroluminescent element 116, an interface 119 with voids is formed, wherein the voids are apt to comprise air and moisture. Therefore, the organic electroluminescent device 100 has low stability and a short operating life span. Further, since there is no buffer layer or a filling layer to separate the color filters from the organic electroluminescent elements, air gaps may exist between the color filters and the organic electroluminescent elements, so that damage may occur easily for that the organic electroluminescent device (such as glass substrate fracture) via the air gaps.

Therefore, a novel organic electroluminescent device to solve the aforementioned problems, while achieving good display quality is needed.

BRIEF SUMMARY OF THE INVENTION

An exemplary embodiment provides a system for displaying images, including a pixel structure. The pixel structure includes a filling layer, a first sub-pixel, a second sub-pixel, and a third sub-pixel, wherein each sub-pixel comprises a color filter layer, and an electroluminescent element corresponding to the color filter layer, and the distance between the first and second sub-pixels is greater than that between the first and third sub-pixels. Further, the transmittances of the color filter layer of the first sub-pixel, the color filter layer of the second sub-pixel, and the color filter layer of the third sub-pixel for a radiance level used for curing the filling layer are determined according to the following equation: transmittance of the color filter layer of the first sub-pixel>transmittance of the color filter layer of the second sub-pixel>transmittance of the color filter layer of the third sub-pixel.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
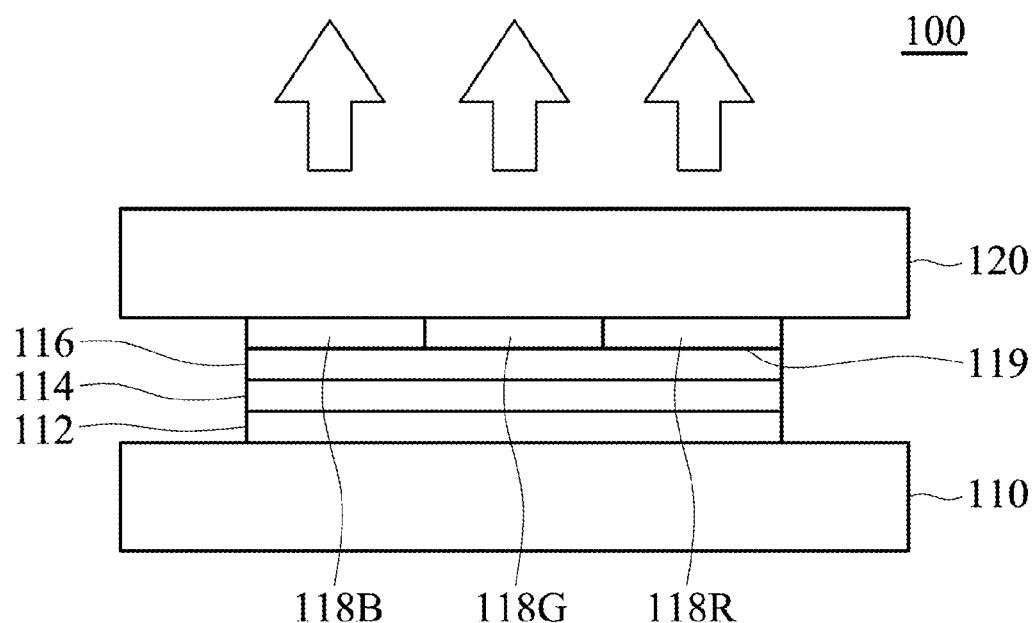
FIG. 1 is a cross-section view of a conventional top emission organic electroluminescent device.
Figure 2:
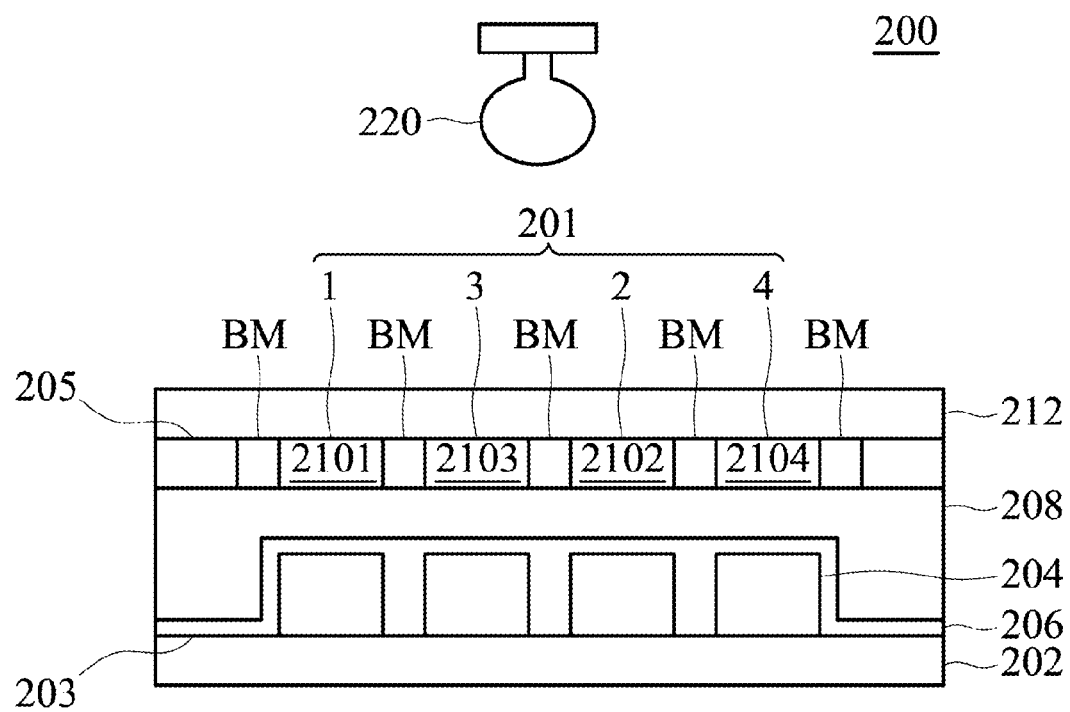
FIG. 2 is a cross-section view of an organic electroluminescent device according to an embodiment of the invention.

Referring to FIG. 2, a pixel structure 201 of an organic electroluminescent device 200 employed by a system for displaying images according to an embodiment of the invention is provided. The organic electroluminescent device 200 can be a top-emission full-color organic electroluminescent device. The pixel structure 201 includes at least three sub-pixels. Herein, the pixel structure 201 has four sub-pixels, including a first sub-pixel 1, a second sub-pixel 2, a third sub-pixel 3, and a fourth sub-pixel 4. Particularly, the first sub-pixel 1, the second sub-pixel 2, the third sub-pixel 3, and the fourth sub-pixel 4 respectively include a first color filter layer 2101, a second color filter layer 2102, a third color filter layer 2103, and a fourth color filter layer 2104. For example, the first sub-pixel 1, the second sub-pixel 2, the third sub-pixel 3, and the fourth sub-pixel 4 can be respectively a white sub-pixel, a green sub-pixel, a blue sub-pixel, and a red sub-pixel. Further, the first color filter layer 2101, the second color filter layer 2102, the third color filter layer 2103, and the fourth color filter layer 2104 can be selected from a group consisting of a red color filter layer, a green color filter layer, a blue color filter layer, and a white color filter layer. In the pixel structure 201, the sub-pixels 1, 2, 3, and 4 are disposed between a bottom substrate 202 and a top substrate 212. Further, the pixel structure has a plurality of organic electroluminescent elements 204 respectively corresponding to the sub-pixels 1, 2, 3, and 4. A passivation layer 206 is conformally formed on the organic electroluminescent elements 204, completely covering the exposed top surface and sidewall of the organic electroluminescent elements 204. The passivation layer 206 can prevent the organic electroluminescent elements 204 during a subsequently formed filling layer, and reduce the probability of air and moisture leaking into the organic electroluminescent elements 204. Further, the pixel structure includes a filling layer 208 disposed between the color filter layers, and the organic electroluminescent elements, wherein the filling layer can be a photocurable layer. After curing the filling layer 208 by a radiance 220, the gap between the color filter layer 2101, 2102, 2103, and 2104, and the organic electroluminescent elements 204 is filled with the filling layer 208. Therefore, there is no air gap formed between the color filter layer 2101, 2102, 2103, and 2104, and the organic electroluminescent elements 204; thereby mitigating trapped air or moisture. Accordingly, the stability and the operating lifespan of the organic electroluminescent element 204 can be increased, and the strength of the organic electroluminescent device 200 can be improved. Moreover, the any two adjacent color filter layers 2101, 2102, 2103, and 2104 can be separated by a black matrix BM, and the black matrix BM can be disposed to surround each color filter layers 2101, 2102, 2103, or 2104.

The bottom substrate 202 can be a glass substrate, plastic substrate, or a semiconductor substrate. The bottom substrate 202 can be a substrate including a required element (such as a thin film transistor). The accompanying drawings illustrate the substrate 202 as a plain rectangle in order to simplify the illustration. According to an embodiment of the invention, a reflection layer (not shown) can be disposed on the top surface 203 of the bottom substrate 202 and the reflective layer can comprise Ag, Al, Au, or combinations thereof. The organic electroluminescent elements 204 of the pixel structure 201 can be the same of different.

According to an embodiment of the invention, the organic electroluminescent element 204 can be a white organic electroluminescent element, including a pair of top and bottom electrodes, and an organic electroluminescent composite layer disposed between the top and bottom electrodes. The top and bottom electrodes can be respectively a transparent or semi-transparent electrode. Suitable materials of the top and bottom electrodes can be indium tin oxide (ITO), indium zinc oxide (IZO), aluminum zinc oxide (AZO), zinc oxide (ZnO), SnO2, In2O3, Al, Cu, Mo, Ti, Pt, Ir, Ni, Cr, Ag, Au, or combinations thereof, formed by a method such as sputtering, electron beam evaporation, thermal evaporation, or chemical vapor deposition methods.

The organic electroluminescent composite layer at least includes a light emitting layer, and can further include a hole injection layer, a hole transport layer, an electron transport layer, and an electron injection layer.

The layers of the organic electroluminescent composite layer can be an organic small molecule material, or polymer material, and can be formed by thermal vacuum evaporation, physical vapor deposition, chemical vapor deposition (organic small molecule material), spin coating, ink-jet printing, or screen printing (polymer material) methods. The emitting layer 131 comprises a light-emitting material and an electroluminescent dopant doped into the light-emitting material and can perform energy transfer or carrier trapping under electron-hole recombination in the emitting layer. The light-emitting material can be fluorescent or phosphorescent materials. The amount of the dopant is not limited and can be optionally modified by a person of ordinary skill in the field. The light-emitting material can be fluorescent or phosphorescent. The composition of the organic electroluminescent element 204 is not limited and can be optionally modified by a person of ordinary skill in the field. The light-emitting material can be fluorescent or phosphorescent. Suitable materials of the passivation layer 206 can be silicon oxide, titanium oxide, aluminum oxide, silicon nitride, or silicon oxynitride materials, or combinations thereof. The filling layer 208 can be formed on the passivation layer 206, bonding the top substrate 212 with the bottom substrate 202. Suitable material of the filling layer 208 can be ultraviolet/visible curable material, such as photocurable resin (epoxy resin, acrylate, polyester, or polyurethane), formed by a method such as a spin-coating, ink-jet printing, or screen printing method. In some embodiments of the invention, the radiance for curing the filling layer 208 has a wavelength of not more than 430 nm, preferably of between 190-430 nm. Further, the top substrate 212 can be a transparent substrate, such as a glass substrate or a plastic substrate.

According to an embodiment of the invention, the process for fabricating the organic electroluminescent device 200 with the pixel structure 201 can be divided into two stages. The first stage of the process includes the following steps: forming a plurality of organic electroluminescent elements 204 on the top surface 203 of the bottom substrate 202, conformally forming a passivation layer 206 on the organic electroluminescent elements 204, and blanketly forming a filling layer 208 on the passivation layer 206. The second stage of the process includes the following steps: forming color filter layers 2101, 2102, 2103, 2104, and a black matrix BM on the bottom surface 205 of the top substrate 212. Next, the bottom substrate 202 and the top substrate 212 are bonded to each other via the filling layer 208; thereby sealing the filling layer 208 and the color filter layers and the black matrix. Finally, the filling layer 208 is subjected to a curing process via the radiance 220 (such as UV curing process).

It should be noted that, since the first color filter layer 2101, the second color filter layer 2102, the third color filter layer 2103, and the fourth color filter layer 2104 have different transmission wavelengths, the first color filter layer 2101, the second color filter layer 2102, the third color filter layer 2103, and the fourth color filter layer 2104 have different transmittance corresponding to the radiance 220.

A key feature of the invention is that the transmittances of the color filter layer 2101, the color filter layer 2102, the color filter layer 2103, and the color filter layer 2104 for the radiance 220 are determined according to the following equation: transmittance of the color filter layer 2101 of the first sub-pixel 1>transmittance of the color filter layer 2102 of the second sub-pixel 2>transmittance of the color filter layer 2103 of the third sub-pixel 3>transmittance of the color filter layer 2104 of the second sub-pixel 4. Further, the pixel structure 201 of the invention has a specific sub-pixel arrangement, which promotes radiance 220 incidence and mitigates formation of an uncured filling layer.

Figure 3:
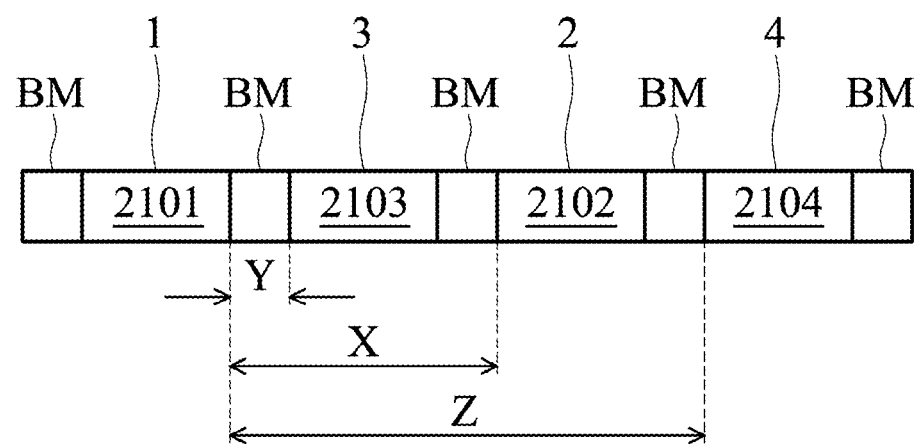
FIG. 3 is a close-up view schematic diagram of FIG. 2, showing the location of the color filter layer and the black matrix.

FIG. 3 is a close-up view schematic diagram of FIG. 2, showing the location of the color filter layer and the black matrix. In the invention, the term "distance" between two sub-pixels means the shortest distance between the color filter layers of each sub-pixel. Herein, the distance X between the first sub-pixel 1 and the second sub-pixel 2 is larger than at least one of the distance Y between the first sub-pixel 1 and the second sub-pixel 3 and the distance Z between the first sub-pixel 1 and the second sub-pixel 4. Namely, the first sub-pixel 1 and the second sub-pixel 2, which have relatively high transmittance, are separated by the third sub-pixel 3 (or the fourth sub-pixel 4) which have relatively low transmittance. Therefore, the radiance 220 can be uniformly introduced into the filling layer, mitigating the formation of an uncured filling layer.

During the process for fabricating the organic electroluminescent device according to an embodiment of the invention, a first step is to determine the material of the filling layer (for example a photocurable material manufactured and sold with a trade number T58-UR009 by Nagasa), and the wavelength range of the radiance 220 (such as a radiance with a wavelength range between 190-430 nm).

Figure 4:
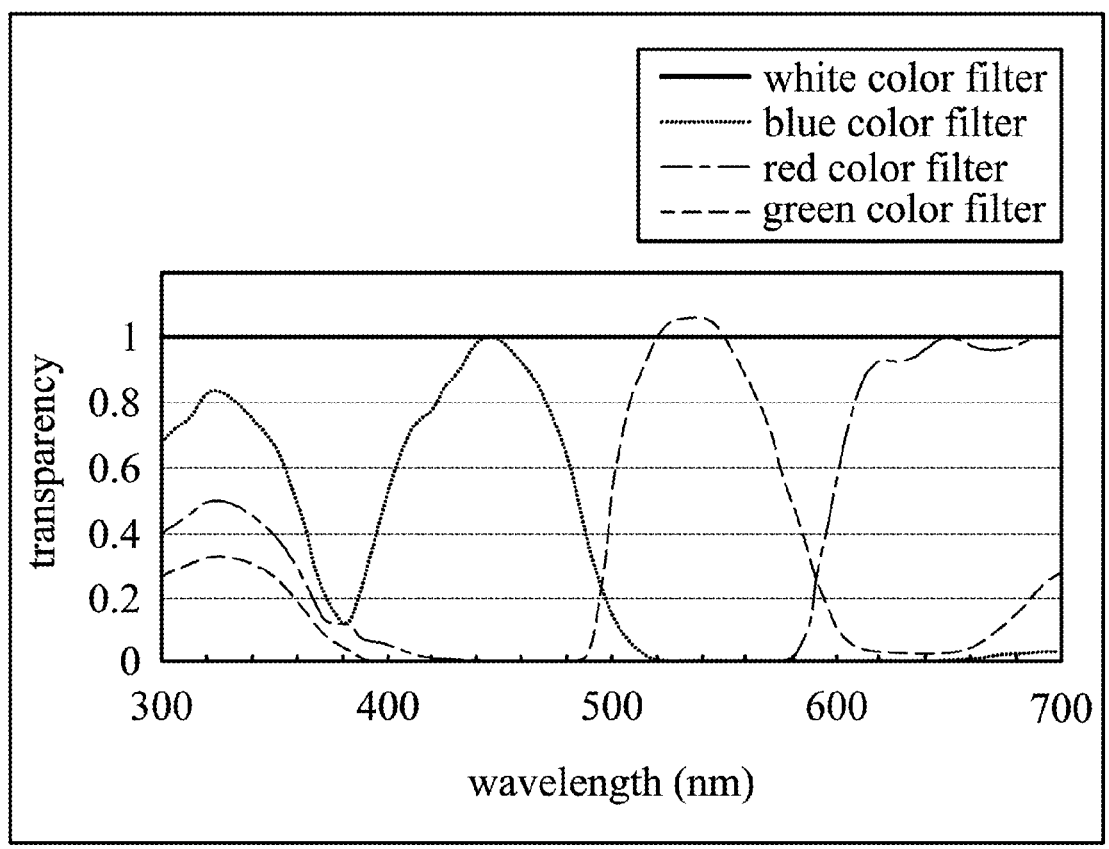
FIG. 4 shows a graph plotting transmittance against wavelength (300~700 nm) of the white, blue, green, and red color filters.

Next, FIG. 4 shows a graph plotting transmittance against wavelength (300~700 nm) of the white, blue, green, and red color filters. In an embodiment of the invention, the radiance for curing the filling layer has a wavelength of 430 nm. Referring to FIG. 4, under the wavelength of 430 nm, the transmittances of the color filters in descending order are: the white color filter layer, the blue color filter layer, the red color filter layer, and green color filter. Accordingly, in the pixel structure, the distance between the white sub-pixel and the blue sub-pixel must be larger than the distance between the white sub-pixel and the green sub-pixel, or the distance between the white sub-pixel and the blue sub-pixel must be larger than the distance between the white sub-pixel and the red sub-pixel distance.

In another embodiment of the invention, the organic electroluminescent device 200 can include a plurality of pixel structures 201 and a surrounding region 250 surrounding the pixel structures 201.

Figure 5:
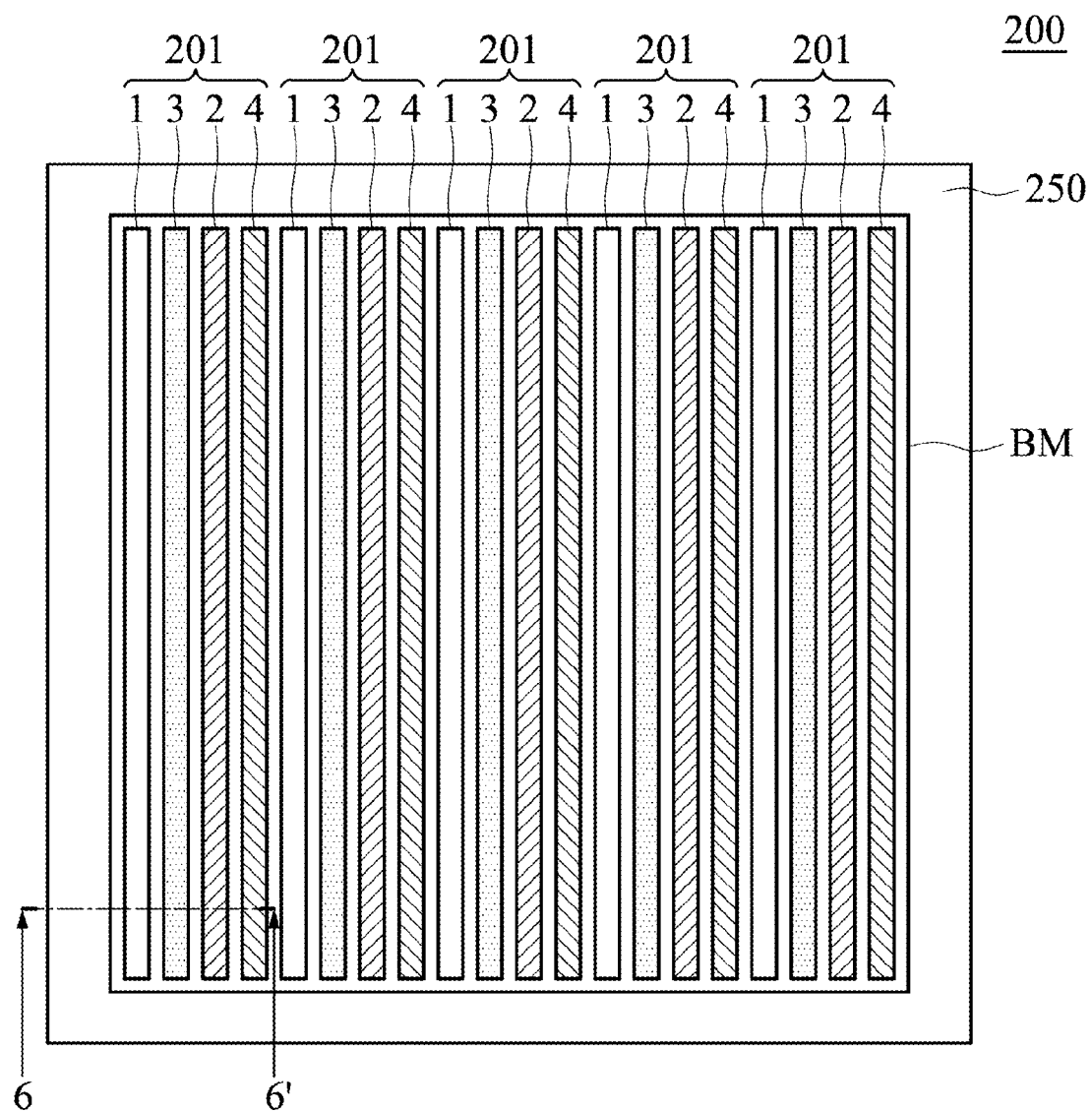
FIG. 5 is a schematic diagram of a pixel structure of an organic electroluminescent device according to an embodiment of the invention, wherein the sub-pixels are arranged in a stripe-like structured arrangement.

Further, the sub-pixels of the pixel structure 201 can be arranged in a stripe-like structured arrangement with a sequence of the first sub-pixel 1 (such as a white sub-pixel), a third sub-pixel 3 (such as a red sub-pixel), a second sub-pixel 2 (such as a blue sub-pixel), and a fourth sub-pixel 4 (such as a green sub-pixel), as shown in FIG. 5 (corresponding to the specific sequence disclosed in FIG. 4).

Figure 6:
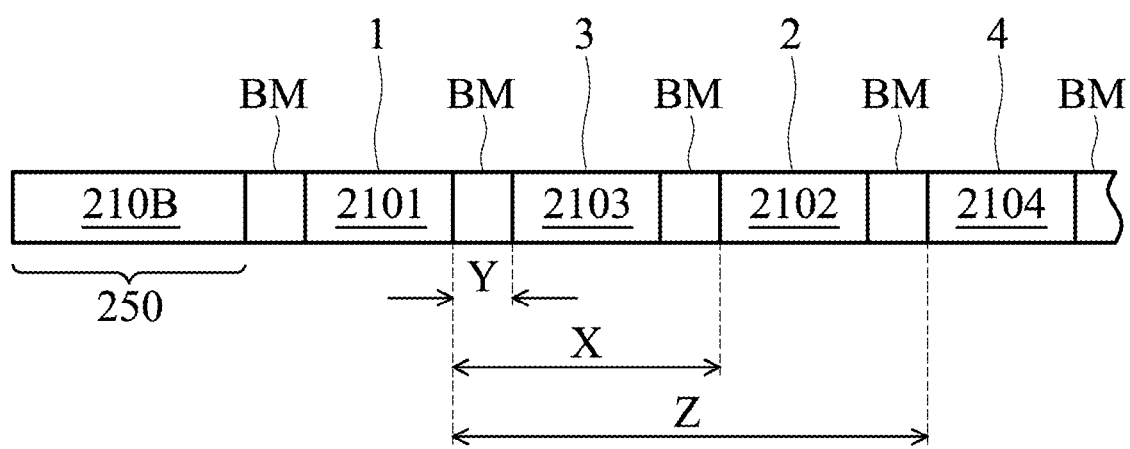
FIG. 6 is a cross section of the pixel structure 201 along line 6-6' of FIG. 5, showing the color filter layer and black matrix.
Figure 7:
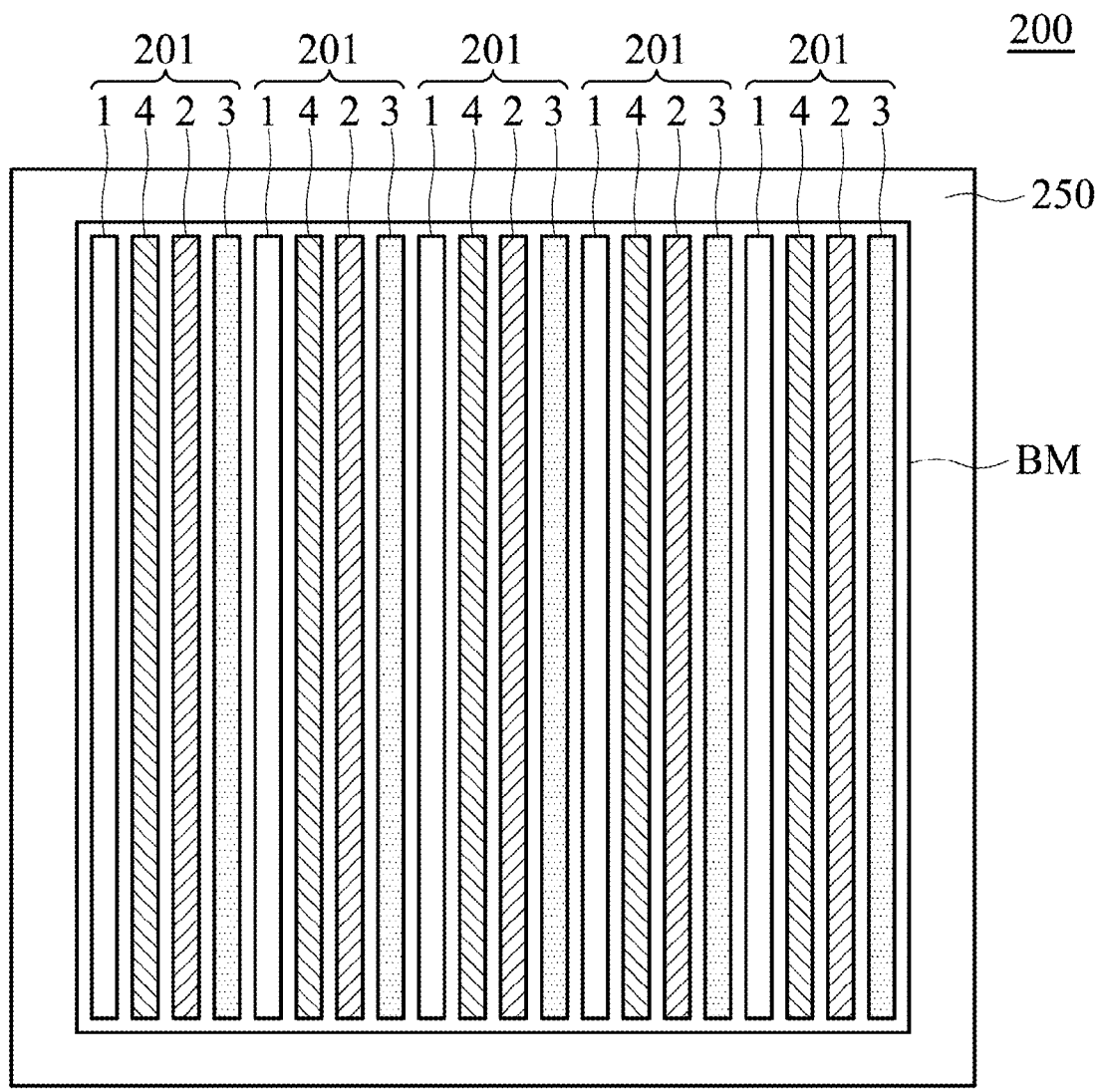
FIG. 7 is a schematic diagram of a pixel structure of an organic electroluminescent device according to another embodiment of the invention, wherein the sub-pixels are arranged in a stripe-like structured arrangement.

FIG. 6 is a cross section of the pixel structure 201 along line 6-6' of FIG. 5, showing the color filter layer and black matrix. Herein, the surrounding region 250 can include a blue color filter layer to enhance the curing effect. In another embodiment of the invention, the first sub-pixel 1 and the second sub-pixel 2 (relatively high transmittance for the radiance 220) can be also separated by the fourth sub-pixel 4. Namely, the sub-pixels are arranged in a sequence of the first sub-pixel 1 (such as a white sub-pixel), a fourth sub-pixel 4 (such as a green sub-pixel), a second sub-pixel 2 (such as a blue sub-pixel), and a third sub-pixel 3 (such as a red sub-pixel), as shown in FIG. 7.

Figure 8:
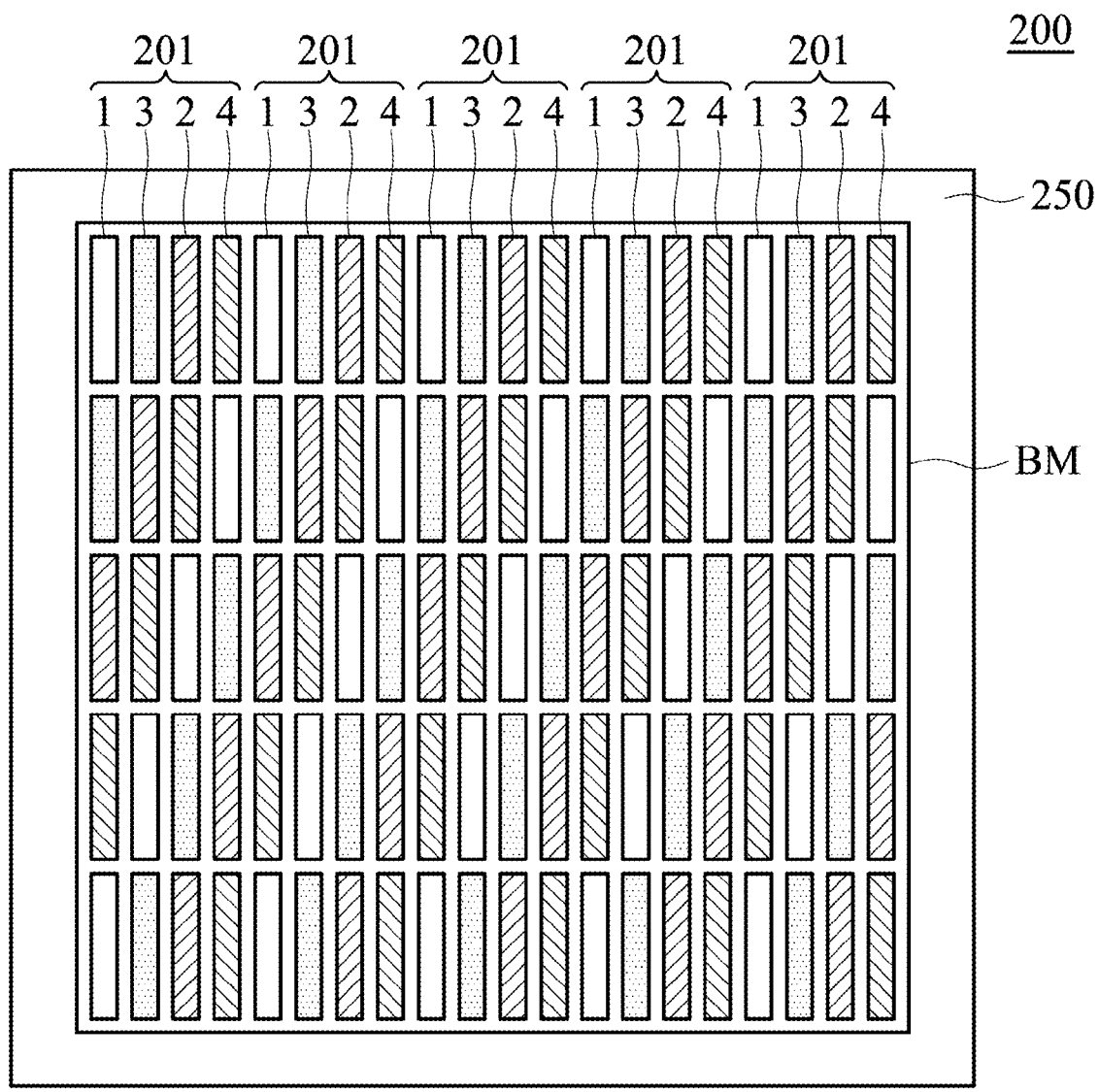
FIGS. 8 and 9 are schematic diagrams of pixel structures according to some embodiments of the invention, wherein the sub-pixels are arranged in a stripe-like structured arrangement.
Figure 9:
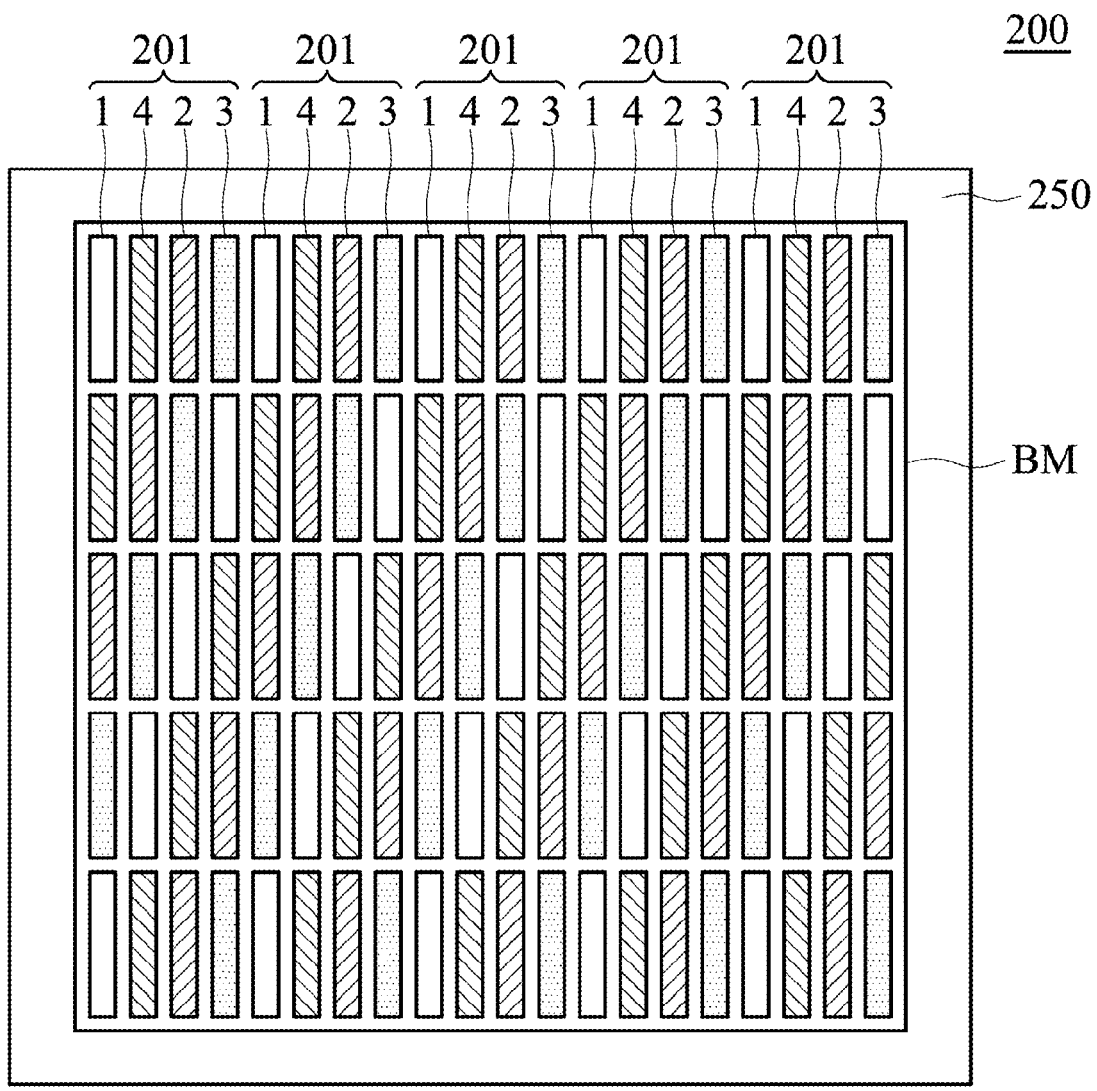

Further, in another embodiment of the invention, the sub-pixels of the pixel structure 201 can be arranged in a mosaic-like structured arrangement with a sequence of the first sub-pixel 1 (such as a white sub-pixel), a third sub-pixel 3 (such as a red sub-pixel), a second sub-pixel 2 (such as a blue sub-pixel), and a fourth sub-pixel 4 (such as a green sub-pixel), referring to FIG. 8. Alternately, the sub-pixels of the pixel structure 201 can be arranged with a sequence of the first sub-pixel 1 (such as a white sub-pixel), a fourth sub-pixel 4 (such as a green sub-pixel), a second sub-pixel 2 (such as a blue sub-pixel), and a third sub-pixel 3 (such as a red sub-pixel), as shown in FIG. 9. Particularly, the transmittances of the color filter layer 2101 of the first sub-pixel 1, the color filter layer 2102 of the second sub-pixel 2, the color filter layer 2103 of the third sub-pixel 3, and the color filter layer 2104 of the fourth sub-pixel 4 for the radiance 220 are determined according to the following equation: transmittance of the color filter layer 2101>transmittance of the color filter layer 2102>transmittance of the color filter layer 2103>transmittance of the color filter layer 2104.

Figure 10:
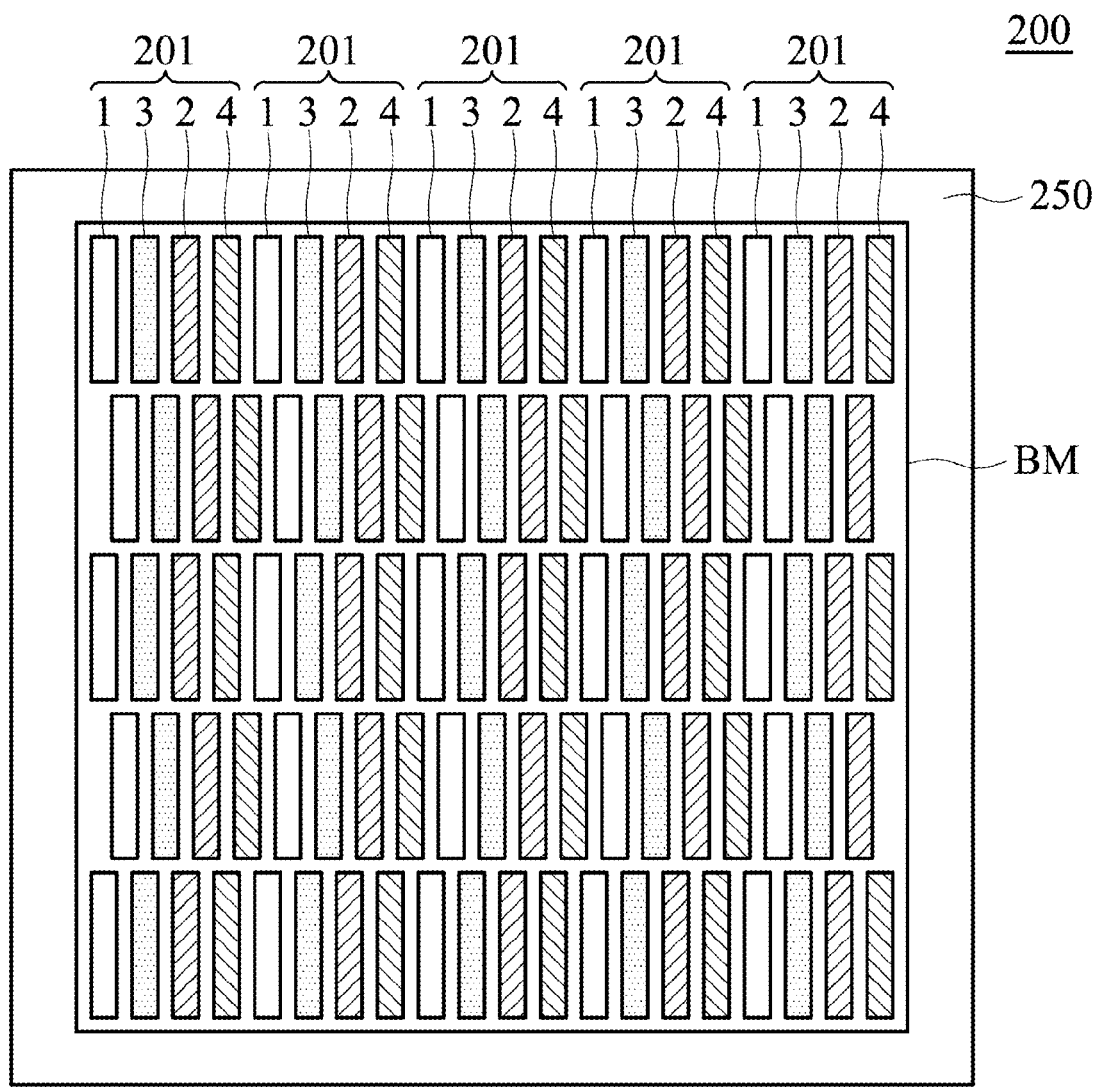
FIGS. 10 and 11 are schematic diagrams of pixel structures according to some embodiments of the invention, wherein the sub-pixels are arranged in a stripe-like structured arrangement.
Figure 11:
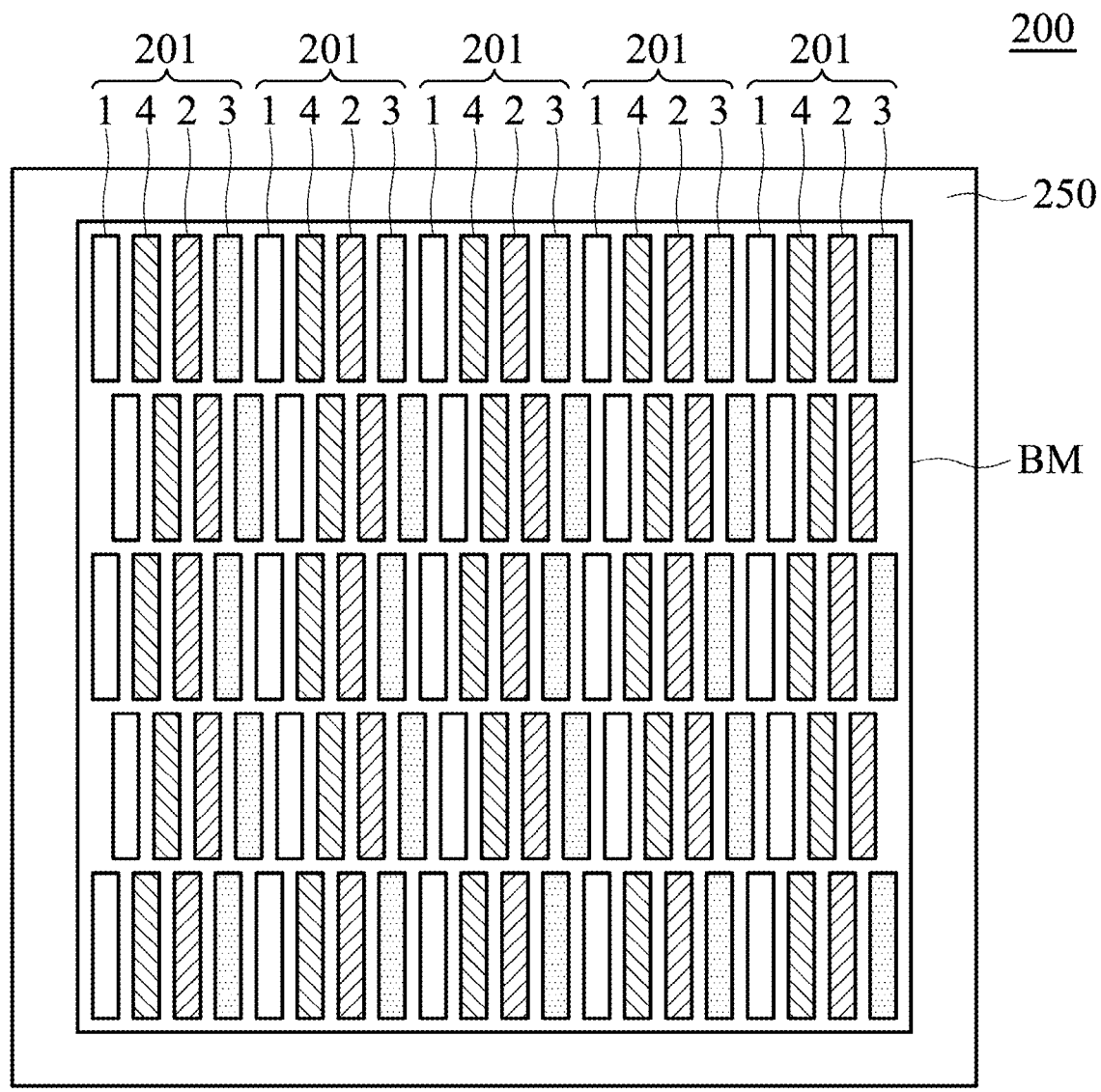

Moreover, in some embodiment of the invention, the sub-pixels of the pixel structure 201 can be arranged in a delta-like structured arrangement with a sequence of the first sub-pixel 1 (such as a white sub-pixel), a third sub-pixel 3 (such as a red sub-pixel), a second sub-pixel 2 (such as a blue sub-pixel), and a fourth sub-pixel 4 (such as a green sub-pixel), referring to FIG. 10. Alternately, the sub-pixels of the pixel structure 201 can be arranged with a sequence of the first sub-pixel 1 (such as a white sub-pixel), a fourth sub-pixel 4 (such as a green sub-pixel), a second sub-pixel 2 (such as a blue sub-pixel), and a third sub-pixel 3 (such as a red sub-pixel), referring to FIG. 11. Particularly, the transmittances of the color filter layer 2101 of the first sub-pixel 1, the color filter layer 2102 of the second sub-pixel 2, the color filter layer 2103 of the third sub-pixel 3, and the color filter layer 2104 of the fourth sub-pixel 4 for the radiance 220 are determined according to the following equation: transmittance of the color filter layer 2101>transmittance of the color filter layer 2102>transmittance of the color filter layer 2103>transmittance of the color filter layer 2104.

It should be noted that, for whatever structure the sub-pixels are arranged in, the distance X between the first sub-pixel 1 and the second sub-pixel 2 is larger than at least one of the distance Y between the first sub-pixel 1 and the second sub-pixel 3 and the distance Z between the first sub-pixel 1 and the second sub-pixel 4.

Figure 12:
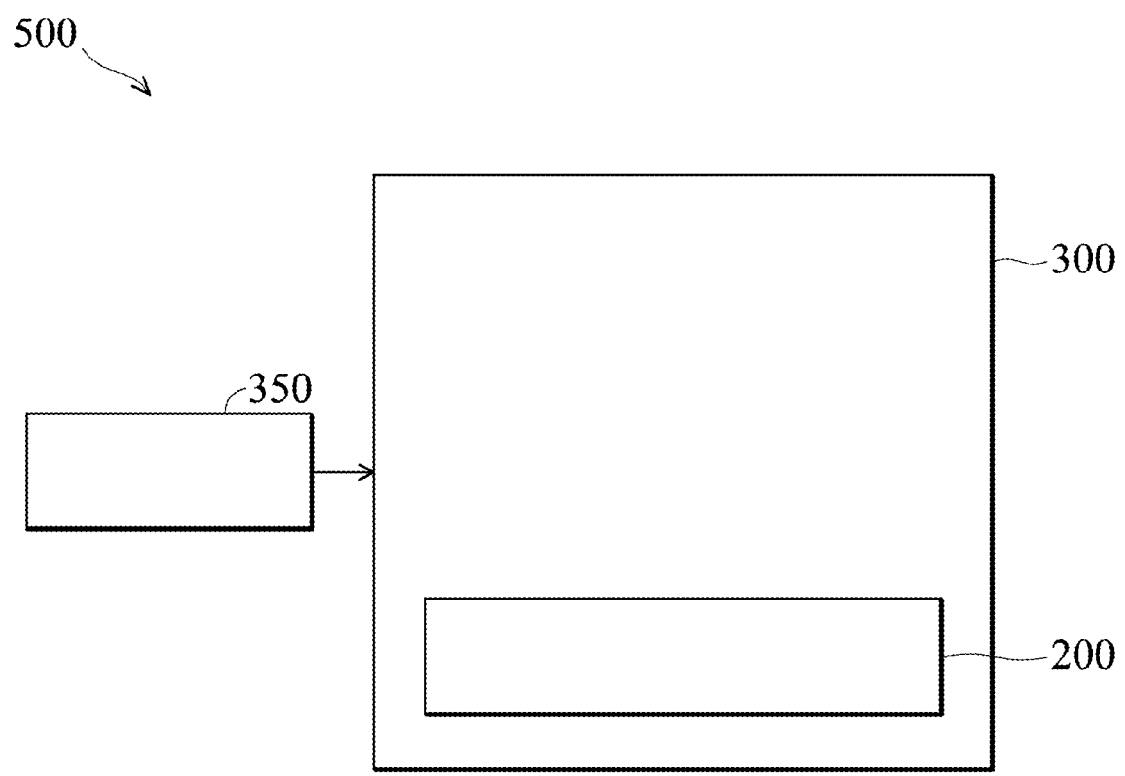
FIG. 12 schematically shows a block diagram of a system for displaying images according to an embodiment of the invention.

FIG. 12 schematically shows another embodiment of a system for displaying images which, in this case, is implemented as a display device 300 or an electronic device 500, such as a notebook computer, mobile phone, digital camera, PDA (personal data assistant), desktop computer, television, car display, or portable DVD player. The display device 300 includes an organic electroluminescent device 200, and the display device 300 can be a full color organic electroluminescent device. In some embodiments, the display panel 300 can form a portion of a variety of electronic devices (in this case, electronic device 500). As shown in FIG. 12, the electronic device 500 can comprise the display device 300 and an input unit 350. Further, the input unit 350 is operatively coupled to the display device 300 and provides input signals (e.g., an image signal) to the display device 300 to generate images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
   a pixel structure, comprising:
   a filling layer; and
   a first sub-pixel, a second sub-pixel, and a third sub-pixel, wherein each sub-pixel comprises a color filter layer, an electroluminescent element corresponding to the color filter layer, and a passivation layer formed on the electroluminescent element and covering the exposed top surface and sidewall of the electroluminescent element, wherein the filling layer disposed between the color filter layer and the passivation layer, and wherein the distance between the first and second sub-pixels is greater than that between the first and third sub-pixels, wherein the transmittances of the color filter layer of the first sub-pixel, the color filter layer of the second sub-pixel, and the color filter layer of the third sub-pixel for a radiance level with a wavelength range between 190-430 nm used for curing the filling layer are determined according to the following equation: the transmittance of the color filter layer of the first sub-pixel is greater than the transmittance of the color filter layer of the second sub-pixel, and wherein the transmittance of the color filter layer of the second sub-pixel is greater than the transmittance of the color filter layer of the third sub-pixel.

2. The system for displaying images as claimed in claim 1, wherein the color filters of the first sub-pixel, the second sub-pixel, and the third sub-pixel is respectively selected from a group consisting of a red color filter layer, a green color filter layer, a blue color filter layer, and a white color filter layer.

3. The system for displaying images as claimed in claim 1, wherein the pixel structure further comprises a fourth sub-pixel, and the transmittances of the color filter layer of the first sub-pixel, the color filter layer of the second sub-pixel, the color filter layer of the third sub-pixel, and the color filter layer of the fourth sub-pixel for the radiance level with a wavelength range between 190-430 nm used for curing the filling layer are determined according to the following equation: the transmittance of the color filter layer of the first sub-pixel>is greater than the transmittance of the color filter layer of the second sub-pixel, wherein the transmittance of the color filter layer of the second sub-pixel is greater than the transmittance of the color filter layer of the third sub-pixel, and wherein the transmittance of the color filter layer of the third sub-pixel is greater than the transmittance of the color filter layer of the fourth sub-pixel.

4. The system for displaying images as claimed in claim 3, wherein the sub-pixels are arranged in a sequence of a white sub-pixel, a red sub-pixel, a blue sub-pixel, and a green sub-pixel.

5. The system for displaying images as claimed in claim 3, wherein the sub-pixels are arranged in a sequence of a white sub-pixel, a green sub-pixel, a blue sub-pixel, and a red sub-pixel.

6. The system for displaying images as claimed in claim 1, wherein the sub-pixels are arranged in a stripe-like structured arrangement.

7. The system for displaying images as claimed in claim 1, wherein the sub-pixels are arranged in a mosaic-like structured arrangement.

8. The system for displaying images as claimed in claim 1, wherein the sub-pixels are arranged in a delta-like structured arrangement.

9. The system for displaying images as claimed in claim 1, further comprising:
a display device, wherein the display device comprises the pixel structure.

10. The system for displaying images as claimed in claim 9, further comprising:
an electronic device, wherein the electronic device comprises:
the display device; and
an input unit coupled to the display device to provide input data to the display device such that the display device displays images.

11. The system for displaying images as claimed in claim 10, wherein the electronic device is a mobile phone, a digital camera, a personal digital assistant, a notebook computer, a desktop computer, a television, a car display, or a portable DVD player.

* * * * *